United States Patent
Kang et al.

(10) Patent No.: US 11,074,990 B2
(45) Date of Patent: Jul. 27, 2021

(54) NONVOLATILE MEMORY DEVICE INCLUDING A PLURALITY OF INPUT/OUTPUT UNITS AND AN OPERATING METHOD THEREOF

(71) Applicant: SAMSUNG ELECTRONICS CO., LTD., Suwon-si (KR)

(72) Inventors: Kyung-Min Kang, Hwaseong-si (KR); Dongku Kang, Seongnam-si (KR); Kwang Won Kim, Seoul (KR); HyunJin Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 16/701,205

(22) Filed: Dec. 3, 2019

(65) Prior Publication Data
US 2020/0105362 A1    Apr. 2, 2020

Related U.S. Application Data

(63) Continuation of application No. 15/632,962, filed on Jun. 26, 2017, now Pat. No. 10,497,459.

(30) Foreign Application Priority Data

Oct. 28, 2016    (KR) .................... 10-2016-0142045

(51) Int. Cl.
| | |
|---|---|
| *G06F 13/20* | (2006.01) |
| *G06F 13/38* | (2006.01) |
| *G06F 3/06* | (2006.01) |
| *G11C 29/00* | (2006.01) |

(Continued)

(52) U.S. Cl.
CPC ........ *G11C 29/789* (2013.01); *G06F 11/1068* (2013.01); *G06F 11/1072* (2013.01);
(Continued)

(58) Field of Classification Search
CPC ............ G06F 13/20; G06F 13/38; G06F 3/06
See application file for complete search history.

(56) References Cited

U.S. PATENT DOCUMENTS

| | | |
|---|---|---|
| 6,958,935 B2 | 10/2005 | Lee et al. |
| 7,679,133 B2 | 3/2010 | Son et al. |

(Continued)

FOREIGN PATENT DOCUMENTS

JP    2008-040723    2/2008

*Primary Examiner* — David E Martinez
(74) *Attorney, Agent, or Firm* — F. Chau & Associates, LLC

(57) ABSTRACT

A nonvolatile memory device includes a memory cell array including first to fourth planes, a page buffer circuit that includes first to fourth page buffer units connected with the first to fourth planes, respectively, an input/output circuit that includes a first input/output unit connected with the first to fourth page buffer units and a second input/output unit connected with the second and fourth page buffer units, and control logic that controls the input/output circuit to output first data from one of the first to fourth page buffer units through the first input/output unit in a first read mode and output second data from one of the first and third page buffer units through the first input/output unit and third data from one of the second and fourth page buffer units through the second input/output unit in a second read mode.

20 Claims, 19 Drawing Sheets

(51) Int. Cl.
  *G11C 16/10* (2006.01)
  *G11C 7/10* (2006.01)
  *G11C 16/26* (2006.01)
  *G11C 5/02* (2006.01)
  *G06F 11/10* (2006.01)
  *G11C 16/12* (2006.01)
  *G11C 16/16* (2006.01)
  *G11C 16/32* (2006.01)
  *G11C 16/34* (2006.01)

(52) U.S. Cl.
  CPC ............ *G11C 5/025* (2013.01); *G11C 7/1006* (2013.01); *G11C 7/1009* (2013.01); *G11C 16/10* (2013.01); *G11C 16/12* (2013.01); *G11C 16/16* (2013.01); *G11C 16/26* (2013.01); *G11C 16/32* (2013.01); *G11C 16/344* (2013.01); *G11C 2211/5642* (2013.01)

(56) References Cited

U.S. PATENT DOCUMENTS

| | | | |
|---|---|---|---|
| 7,934,074 | B2 | 4/2011 | Lee et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,659,638 | B1 * | 5/2017 | Shin ................... G11C 16/08 |
| 2010/0030948 | A1 | 2/2010 | Moon et al. |
| 2010/0082917 | A1 | 4/2010 | Yang et al. |
| 2011/0233648 | A1 | 9/2011 | Seol et al. |
| 2014/0068159 | A1 | 3/2014 | Yi et al. |
| 2015/0161042 | A1 | 6/2015 | Liang et al. |
| 2016/0011779 | A1 | 1/2016 | Lee |
| 2016/0026387 | A1 | 1/2016 | Lin et al. |
| 2016/0358657 | A1 | 12/2016 | Kim et al. |
| 2018/0122496 | A1 | 5/2018 | Kang et al. |

* cited by examiner

NONVOLATILE MEMORY DEVICE INCLUDING A PLURALITY OF INPUT/OUTPUT UNITS AND AN OPERATING METHOD THEREOF

CROSS-REFERENCE TO RELATED APPLICATIONS

This application is a continuation of U.S. patent application Ser. No. 15/632,962 filed on Jun. 26, 2017, which claims priority under 35 U.S.C. § 119 to Korean Patent Application No. 10-2016-0142045 filed Oct. 28, 2016, in the Korean Intellectual Property Office, the disclosures of which are incorporated by reference herein in their entireties.

TECHNICAL FIELD

Exemplary embodiments of the inventive concept disclosed herein relate to a semiconductor memory device, and more particularly, to a nonvolatile memory device that includes a plurality of input/output units and an operating method thereof.

DISCUSSION OF RELATED ART

Semiconductor memory devices may be classified as volatile semiconductor memory devices or nonvolatile semiconductor memory devices.

A volatile semiconductor memory device has fast read and write speeds, but loses stored data in the absence of power. A nonvolatile semiconductor memory device retains stored data even when not powered. Examples of the nonvolatile semiconductor memory device include a mask read-only memory (MROM), a programmable ROM (PROM), an erasable programmable ROM (EPROM), an electrically erasable programmable ROM (EEPROM), etc.

SUMMARY

According to an exemplary embodiment of the inventive concept, a nonvolatile memory device includes a memory cell array including first, second, third and fourth planes, a page buffer circuit that includes first, second, third and fourth page buffer units, wherein the first, second, third and fourth planes are connected to the first, second, third and fourth page buffer units, respectively, an input/output circuit that includes a first input/output unit connected with the first, second, third and fourth page buffer units and a second input/output unit connected with the second and fourth page buffer units, and control logic that controls the input/output circuit to output first data from one of the first, second, third and fourth page buffer units through the first input/output unit in a first read mode and to output second data from one of the first and third page buffer units through the first input/output unit and third data from one of the second and fourth page buffer units through the second input/output unit in a second read mode.

According to an exemplary embodiment of the inventive concept, an operating method of a nonvolatile memory device that includes first, second, third and fourth planes, the method includes receiving first data, dividing the first data into first and second partial data and storing the first partial data in the first plane and the second partial data in the second plane, receiving second data, dividing the second data into third and fourth partial data and storing the third partial data in the third plane and the fourth partial data in the fourth plane, outputting one of the first, second, third and fourth partial data through the first input/output unit in a first read mode, and outputting two of the first, second, third and fourth partial data through the first input/output unit and the second input/output unit in a second read mode.

According to an exemplary embodiment of the inventive concept, a nonvolatile memory device includes: a memory cell array including a plurality of planes; a page buffer circuit that includes a plurality of page buffer units, wherein each page buffer unit is connected to a different one of the planes; an input/output circuit that includes a first input/output unit connected with each of the page buffer units and a second input/output unit connected with only some of the page buffer units, and control logic that controls the input/output circuit to output first data from each of the page buffer units through the first input/output unit in a first read mode and to output second data from a first buffer unit of the buffer units through the first input/output unit and third data from a second buffer unit of the page buffer units through the second input/output unit in the second read mode.

DETAILED DESCRIPTION OF THE EMBODIMENTS

Figure 1:
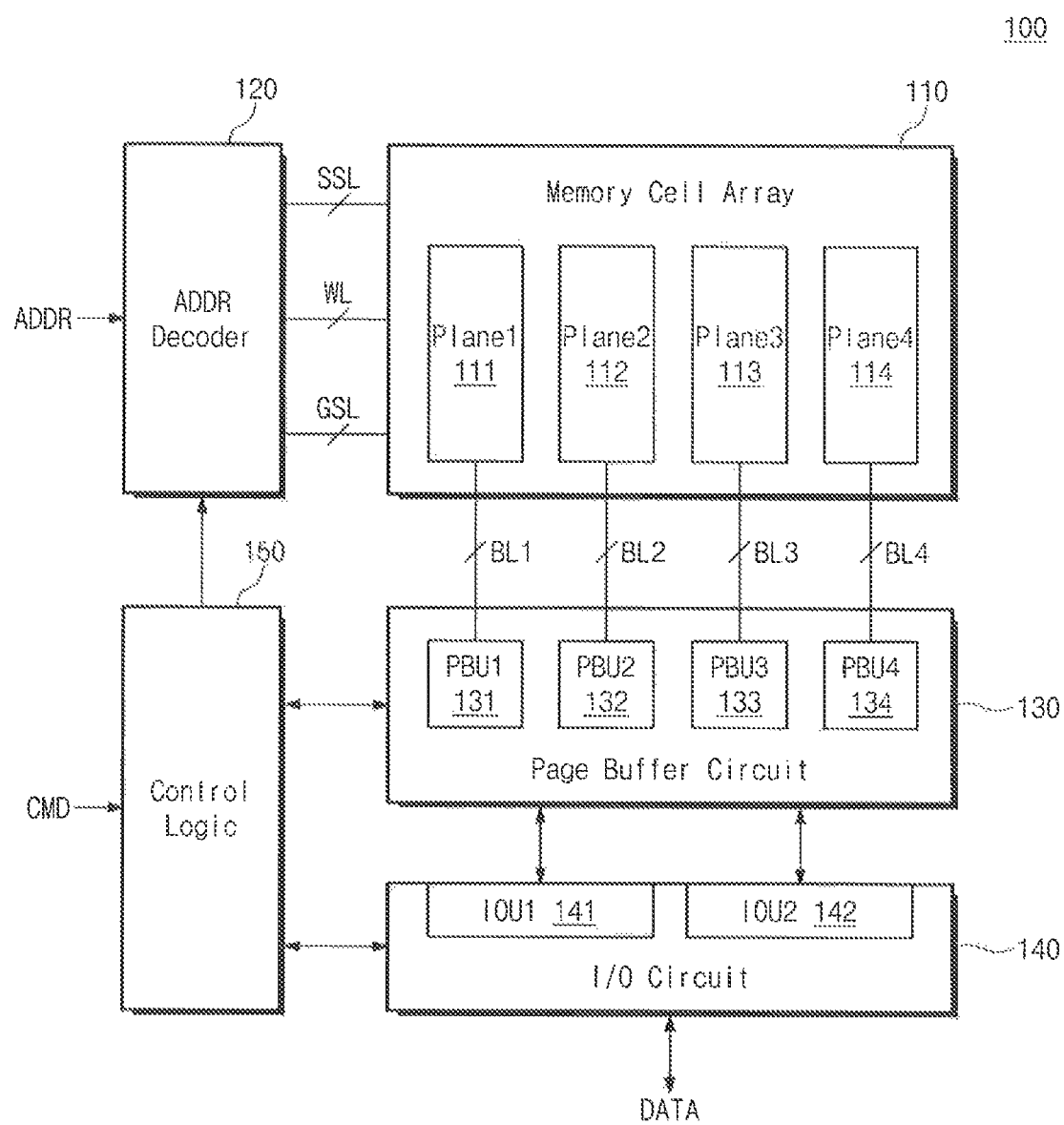
FIG. 1 is a block diagram illustrating a nonvolatile memory device, according to an exemplary embodiment of the inventive concept.

Below, exemplary embodiments of the inventive concept will be described in detail with reference to the accompanying drawings. In the drawings, like reference numerals may refer to like parts.

FIG. 1 is a block diagram illustrating a nonvolatile memory device, according to an exemplary embodiment of the inventive concept. Referring to FIG. 1, a nonvolatile memory device 100 may include a memory cell array 110, an address decoder 120, a page buffer circuit 130, an input/output circuit 140, and control logic 150.

The memory cell array 110 may be connected to the address decoder 120 and the page buffer circuit 130. For example, the memory cell array 110 may be connected to the address decoder 120 through string selection lines SSL, word lines WL, and ground selection lines GSL. In addition, the memory cell array 110 may be connected to the page buffer circuit 130 through bit lines BL (e.g., BL1 to BL4).

The memory cell array 110 may include a plurality of memory blocks. Memory cells of each memory block may have a two-dimensional (2D) structure. In addition, the memory cells of each memory block may have a three-dimensional (3D) structure in which the memory cells are stacked in a direction perpendicular to a substrate, for example. Each memory block may include a plurality of memory cells and a plurality of selection transistors. The memory cells may be connected to the word lines WL, and the selection transistors may be connected to the string, selection lines SSL or the ground selection lines GSL. Memory cells of each memory block may store one or more bits.

In an exemplary embodiment of the inventive concept, the memory cell array 110 may be implemented with a 3D memory array. The 3D memory array may be monolithically formed in one or more physical level(s) of arrays of memory cells having an active area array ed on a silicon substrate and circuitry associated with an operation of the memory cells. The circuit related to an operation of the memory cells may be located in a substrate or on a substrate. The terra "monolithic" may mean that layers of each level of the array are directly deposited on the layers of each underlying level of the array.

In an exemplary embodiment of the inventive concept, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. At least one selection transistor may have the same structure as the memory cells and may be monolithically formed together with memory cells.

The following patent documents which are incorporated by reference herein in their entireties, describe configurations for 3D memory arrays, in which a 3D memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

The memory cell array 110 may include a plurality of planes. For example, the memory cell array 110 may include first to fourth planes 111 to 114. Each of the first to fourth planes 111 to 114 may include a plurality of memory blocks. Each of the first to fourth planes 111 to 114 may be connected with one page buffer unit through bit lines. In an exemplary embodiment of the inventive concept, the first plane 111 may be connected with a first page buffer unit 131 through first bit lines BL1. The second plane 112 may be connected with a second page buffer unit 132 through second bit lines BL2. The third plane 113 may be connected with a third page buffer unit 133 through third bit lines BL3. The fourth plane 114 may be connected with a fourth page buffer unit 134 through fourth bit lines BL4. Each of the first to fourth planes 111 to 114 may refer to a physical plane.

The address decoder 120 may be connected to the memory cell array 110 through a plurality of lines. For example, the plurality of lines may include the string selection lines SSL, the word lines WL, and the ground selection lines GSL. The address decoder 120 may be configured to operate under control of the control logic 150.

The address decoder 120 may receive an address ADDR from the outside. The address decoder 120 may decode a row address of the address ADDR. The address decoder 120 may select a word line corresponding to the decoded row address. For example, the address decoder 120 may select a word line corresponding to the address ADDR, based on the decoded row address.

During an erase operation, the address decoder 120 may select a memory block to be erased. The address decoder 120 may apply bias voltages to some of the plurality of lines and may float the remaining lines (e.g., the lines that did not receive the bias voltages). Time points, at which the remaining lines of the plurality of lines are floated, may be respectively determined by the control logic 150. In an exemplary embodiment of the inventive concept, a word line erase voltage may be applied to each word line of a selected memory block. An erase voltage may be applied to a substrate or a pocket well of the memory cell array 110. In the case of using a ground select line (GSL) delayed scheme, ground selection lines may be floated after a specific delay time elapses from a point in time when the erase voltage is applied to the substrate or the pocket well.

The address decoder 120 may decode a column address of the received address ADDR. The address decoder 120 may transmit the decoded column address to the page buffer circuit 130. In an exemplary embodiment of the inventive concept, the address decoder 120 may include a row decoder for decoding a row address, a column decoder for decoding a column address, and an address buffer for storing the address ADDR.

The page buffer circuit 130 may be connected to the memory cell array 110 through the bit lines BL. The page buffer circuit 130 operates under control of the control logic 150. The page buffer circuit 130 may receive the decoded column address from the address decoder 120. The page buffer circuit 130 may select the bit lines BL by using the decoded column address.

In an exemplary embodiment of the inventive concept, the page buffer circuit 130 may receive data from the outside and may write the received data in the memory cell array 110. The page buffer circuit 130 reads data from the memory cell array 110 and transmits the read data to the outside through the input/output circuit 140. The page buffer circuit 130 may read data from a first storage area of the memory cell array 110 and may write the read data in a second storage area of the memory cell array 110. For example, the page buffer circuit 130 may perform a copy-back operation.

The page buffer circuit 130 may include a plurality of, for example, first to fourth page hater units 131 to 134. For example, the first to fourth page buffer units 131 to 134 may be respectively connected with the first to fourth planes 111 to 114. Each of the first to fourth page buffer units 131 to 134 may have the same size as a page of the first to fourth planes 111 to 114 to which it corresponds.

The input/output circuit 140 may be connected to the memory cell array 110 through the page buffer circuit 130 and may exchange data with the outside. The input/output circuit 140 may operate under control of the control logic circuit 150. For example, the input/output circuit 140 may include first and second input/output units 141 and 142. The first and second input/output units 141 and 142 may be used together or independently based on a read mode.

The control logic 150 may be connected to the address decoder 120, the page buffer circuit 130, and the input/output circuit 140. The control logic 150 may control overall operations of the nonvolatile memory device 100. The control logic 150 may operate in response to a command CMD transmitted from the outside.

The control logic 150 may control the page buffer circuit 130 and the input/output circuit 140 based on a read mode. For example, only the first input/output unit 141 may be used in a first read mode under control of the control logic 150. The first and second input/output units 141 and 142 may be used together in a second read mode under control of the control logic 150. Accordingly, a read speed of the second read mode may be faster than a read speed of the first read mode. In an exemplary embodiment of the inventive concept, assuming that each of first and second input/output units 141 and 142 transmits data in units of 8 bits, data may be transmitted in the first read mode in units of 8 bits, and data may be transmitted in the second read mode in units of 16 bits.

Figure 2:
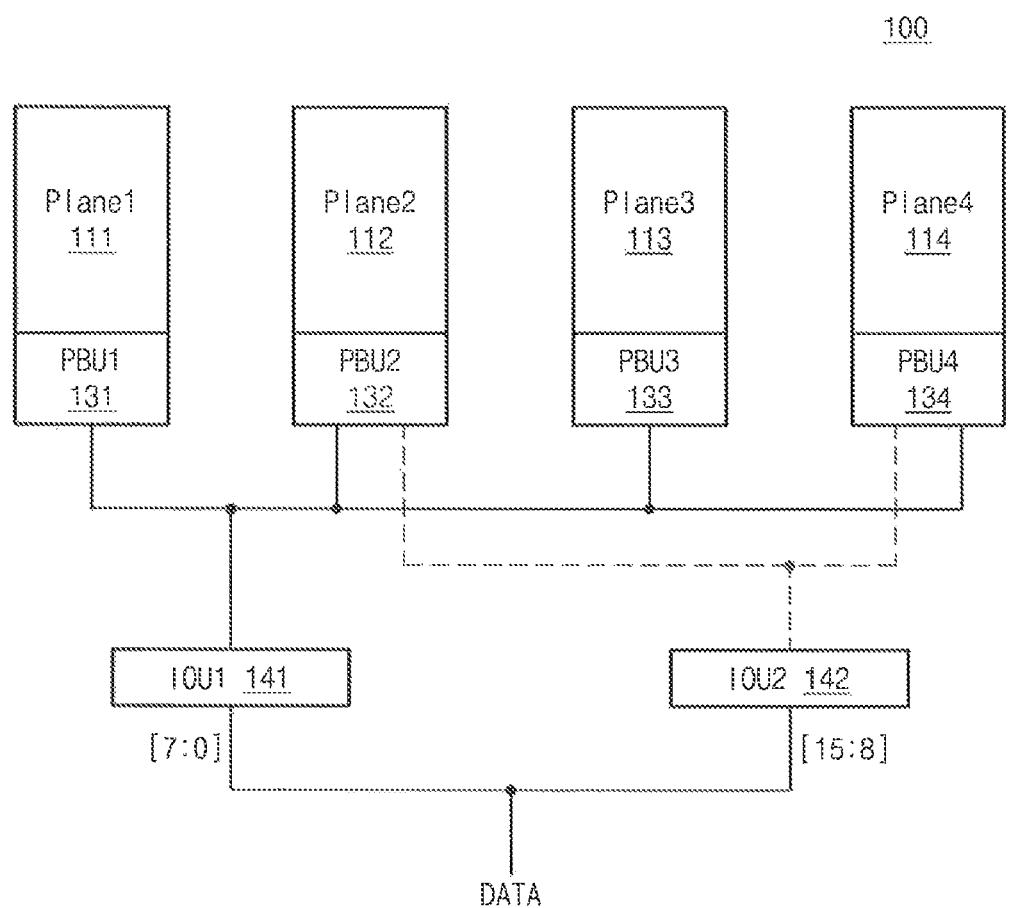
FIG. 2 is a drawing illustrating a connection relationship between planes and input/output units, according to an exemplary embodiment of the inventive concept.

FIG. 2 is a drawing illustrating a connection relationship between planes and input/output units, according to an exemplary embodiment of the inventive concept. Referring to FIGS. 1 and 2, the nonvolatile memory device 100 may include the first to fourth planes 111 to 114, the first to fourth page buffer units 131 to 134, and the first and second input/output units 141 and 142. The first to fourth planes 111 to 114 may be connected with the first to fourth page buffer units 131 to 134, respectively.

For example, the first input/output unit 141 may be connected with all the first to fourth page buffer units 131 to 134. The second input/output unit 142 may be connected with the second and fourth page buffer units 132 and 134. The connection between first and second input/output units 141 and 142 and the first to fourth page buffer units 131 to 134 may be changed according to a read mode.

Figure 3:
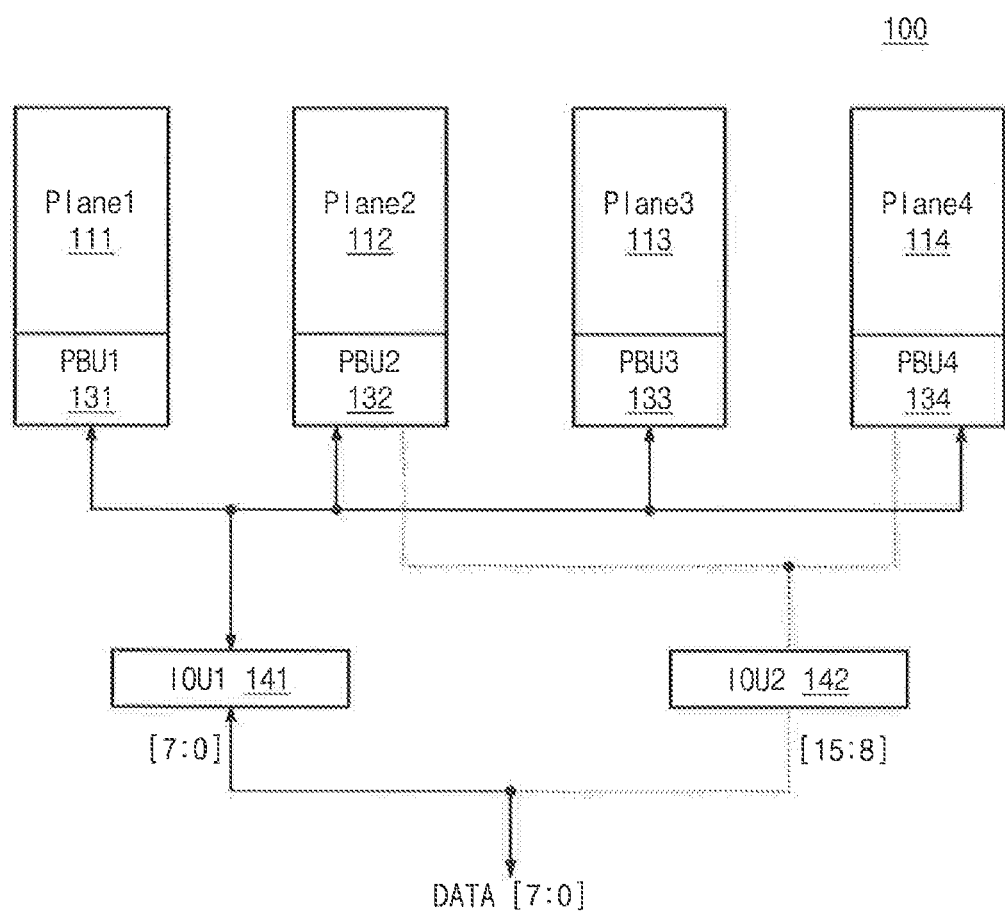
FIG. 3 is a drawing illustrating data input/output of a first read mode in a connection relationship of FIG. 2, according to an exemplary embodiment of the inventive concept.

FIG. 3 is a drawing illustrating data input/output of a first read mode in a connection relationship of FIG. 2, according to an exemplary embodiment of the inventive concept. Referring to FIG. 3, in the first read mode, the nonvolatile memory device 100 may activate the first input/output unit 141 and may deactivate the second input/output unit 142. Each of the first to fourth page buffer units 131 to 134 may input and output data only through the first input/output unit 141. For example, if the first input/output unit 141 inputs and outputs data in units of 8 bits, the nonvolatile memory device 100 may input and output data in units of 8 bits. In the case where a host maps one logical plane onto one physical plane, the nonvolatile memory device 100 may input and output data to and from each page buffer unit through the first input/output unit 141 as illustrated in FIG. 3.

Figure 4:
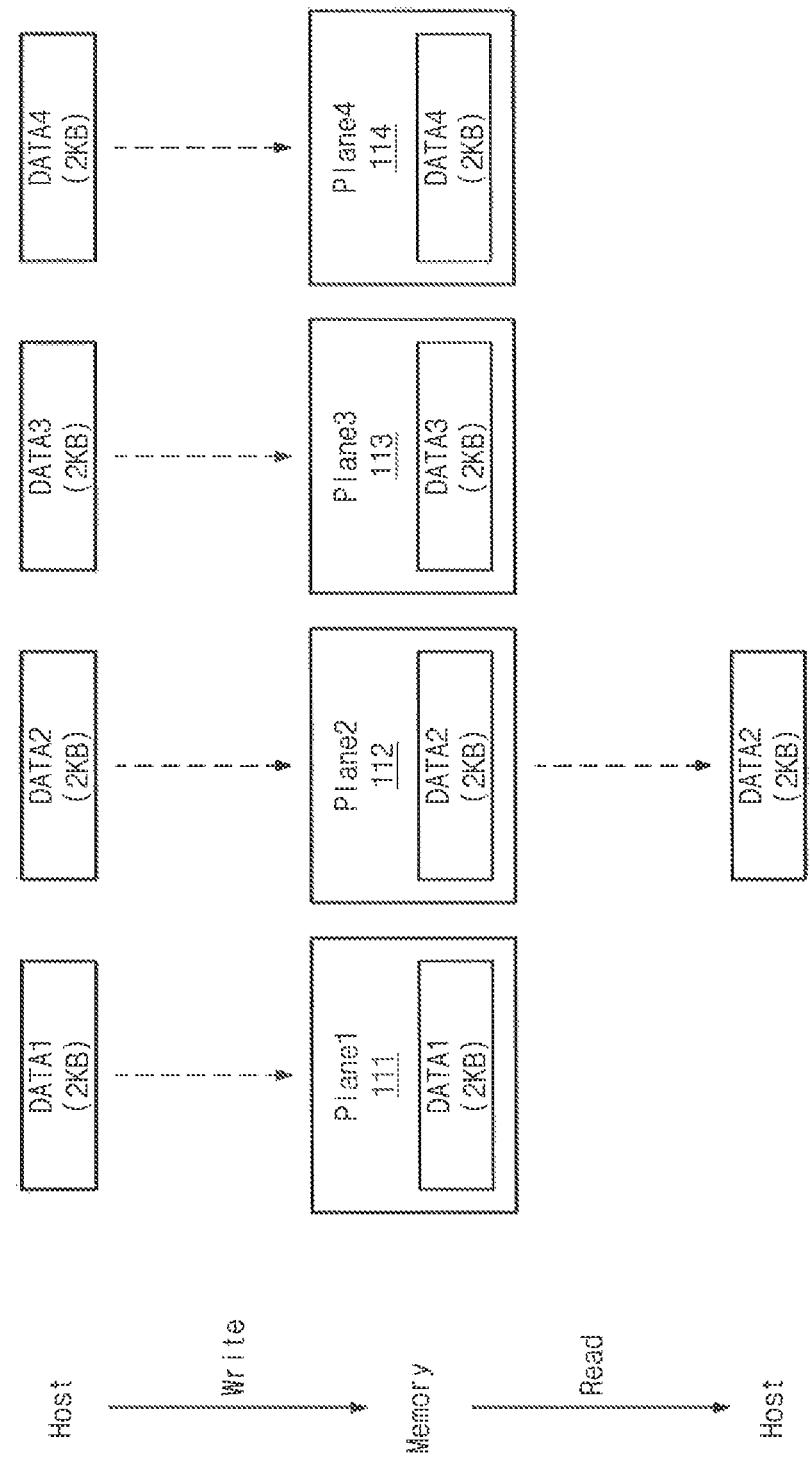
FIG. 4 is a drawing illustrating data input/output in a first read mode of FIG. 3, according to an exemplary embodiment of the inventive concept.

FIG. 4 is a drawing illustrating data input/output in a first read mode of FIG. 3, according to an exemplary embodiment of the inventive concept. Referring to FIG. 4, the nonvolatile memory device 100 may be requested by a host to write first to fourth data DATA1 to DATA4. For example, each of the first to fourth data DATA1 to DATA4 may have a size of 2 KB. The nonvolatile memory device 100 may store the first to fourth data DATA1 to DATA4 in the first to fourth planes 111 to 114, respectively. In this case, the size of each of the first to fourth page buffer units 131 to 134 is 2 KB. The nonvolatile memory device 100 may be requested by the host to read the first to fourth data DATA1 to DATA4. The nonvolatile memory device 100 may read and output each of the first to fourth data DATA1 to DATA4. For example, the second data DATA2 in the second page buffer unit 132 may be output in response to the read request.

Figure 5:
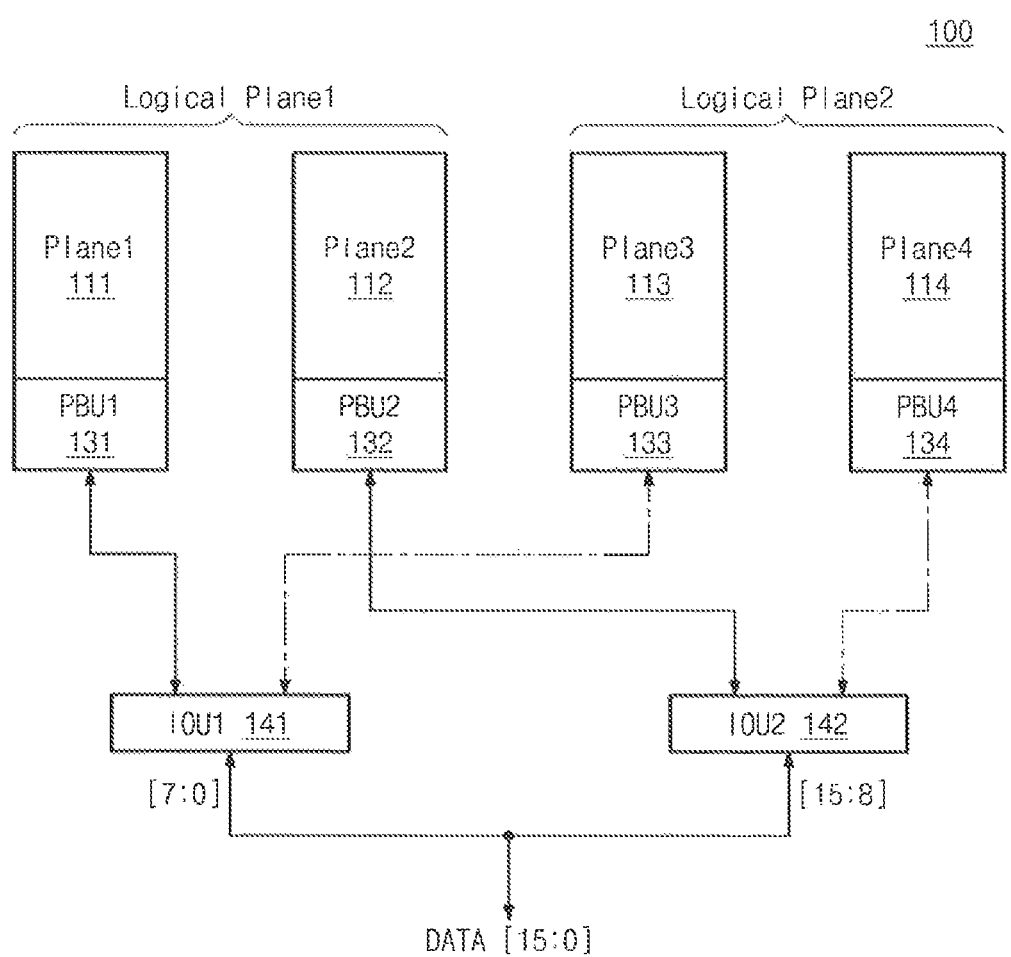
FIG. 5 is a drawing illustrating data input/output of a second read mode in a connection relationship of FIG. 2, according to an exemplary embodiment of the inventive concept.

FIG. 5 is a drawing illustrating data input/output of a second read mode in a connection relationship of FIG. 2, according to an exemplary embodiment of the inventive concept. Referring to FIG. 5, in the second read mode, the nonvolatile memory device 100 may activate both the first and second input/output units 141 and 142. Each of the first and third page buffer units 131 and 133 may input and output data only through the first input/output unit 141. Each of the second and fourth page buffer units 132 and 134 may input and output data only through the second input/output unit 142. The nonvolatile memory device 100 may input and output a portion of data through the first input/output unit 141 and may input and output the rest of the data through the second input/output unit 142. For example, if each of the first and second input/output units 141 and 142 inputs and outputs data in units of 8 bits, the nonvolatile memory device 100 input and output data in units of 16 bits.

In addition, the host may map the first and second planes 111 and 112 onto a first logical plane. The host may map the third and fourth planes 113 and 114 onto a second logical plane. The mapping may be referred to as "alignment mapping".

Figure 6:
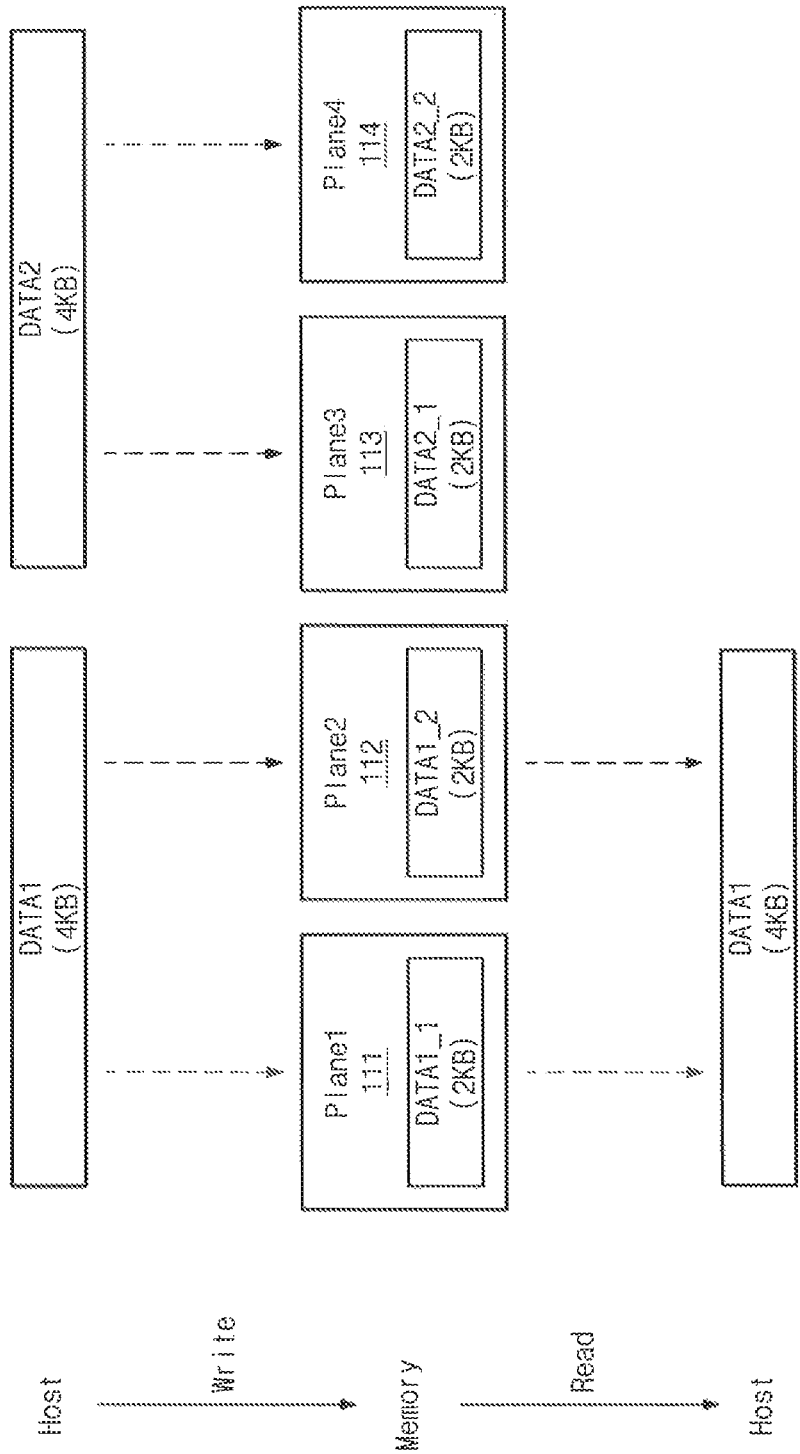
FIG. 6 is a drawing illustrating data input/output in a second read mode of FIG. 5, according to an exemplary embodiment of the inventive concept.

FIG. 6 is a drawing illustrating data input/output in a second read mode of FIG. 5, according to an exemplary embodiment of the inventive concept. Referring to FIG. 6, the nonvolatile memory device 100 may be requested by a host to write first and second data DATA1 and DATA2. For example, each of the first and second data DATA1 and DATA2 may have a size of 4 KB. The nonvolatile memory device 100 may store the first and second data DATA1 and DATA2 in the first to fourth planes 111 to 114. In this case, the size of each of the first to fourth page buffer units 131 to 134 is 2 KB. Accordingly, the first data DATA1 are stored in the first and second planes 111 and 112. Partial data DATA1_1, of the first data DATA1 may be stored in the first plane 111. Partial data DATA1_2 of the first data DATA1 may be stored in the second plane 112. Partial data DATA2_1 of the second data DATA2 may be stored in the third plane 113. Partial data DATA2_2 of the second data DATA2 may be stored in the fourth plane 114.

In addition, the nonvolatile memory device 100 may be requested to read each of the first and second data DATA1 and DATA2. The nonvolatile memory 100 may read and output partial data for each logical plane. For example, the nonvolatile memory device 100 may read the partial data DATA1_1 and DATA1_2 from the first and second planes 111 and 112 to output the first data DATA1. In addition, the nonvolatile memory device 100 may read the partial data DATA2_1 and DATA2_2 from the third and fourth planes 113 and 114 to output the second data DATA2.

Figure 7:
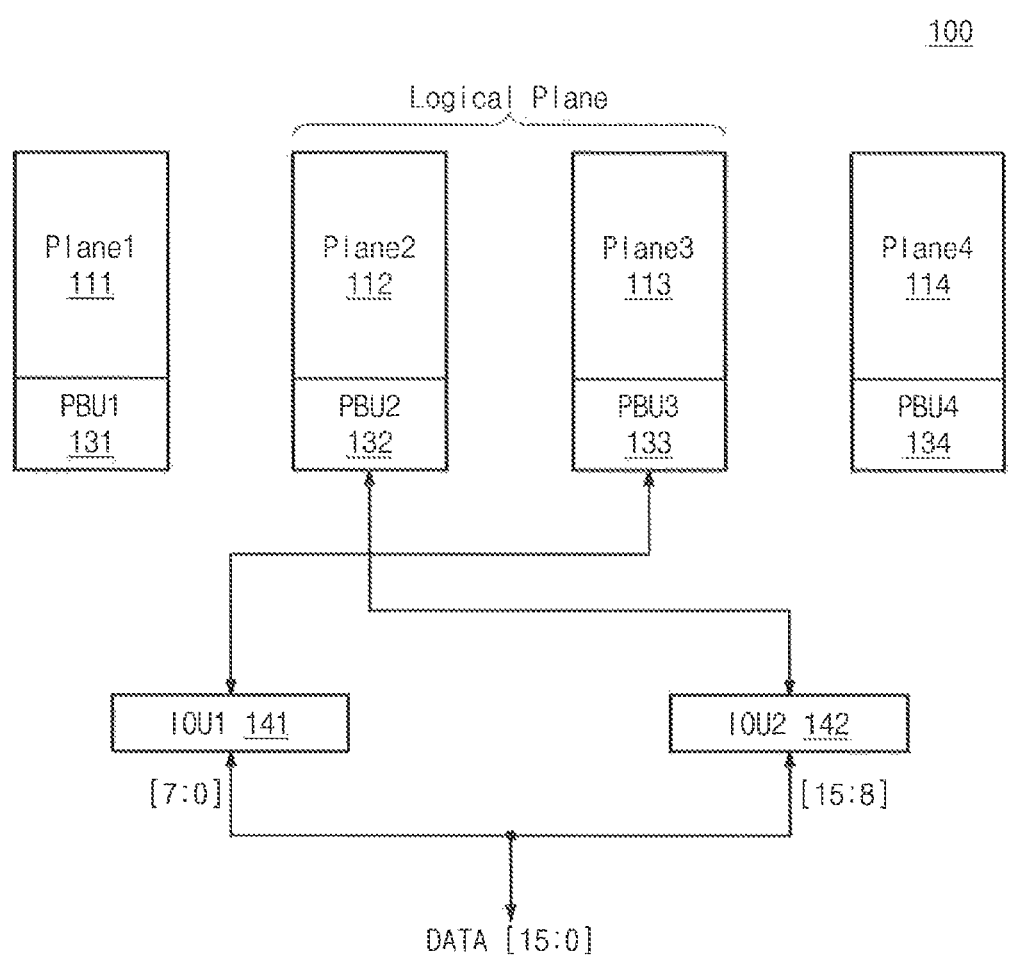
FIG. 7 is a drawing illustrating a method of inputting and outputting data based on a misalignment mapping, according to an exemplary embodiment of the inventive concept.

FIG. 7 is a drawing illustrating a method of inputting and outputting data based on a misalignment mapping, according to an exemplary embodiment of the inventive concept. Referring to FIG. 7, a host may map a logical plane onto physical planes in a manner that is different from that described with reference to FIG. 5. For example, the host may map the second and third planes 112 and 113 onto one logical plane. Like the structure described with reference to FIG. 3, data may be input to and output from the second plane 112 through the second input/output unit 142. In addition, data may be input to and output from the third plane 113 through the first input/output unit 141. Accordingly, lower bits [7:0] of the data may be stored in the third plane 113. Upper bits [15:8] of the data may be stored in the second plane 112.

Figure 8:
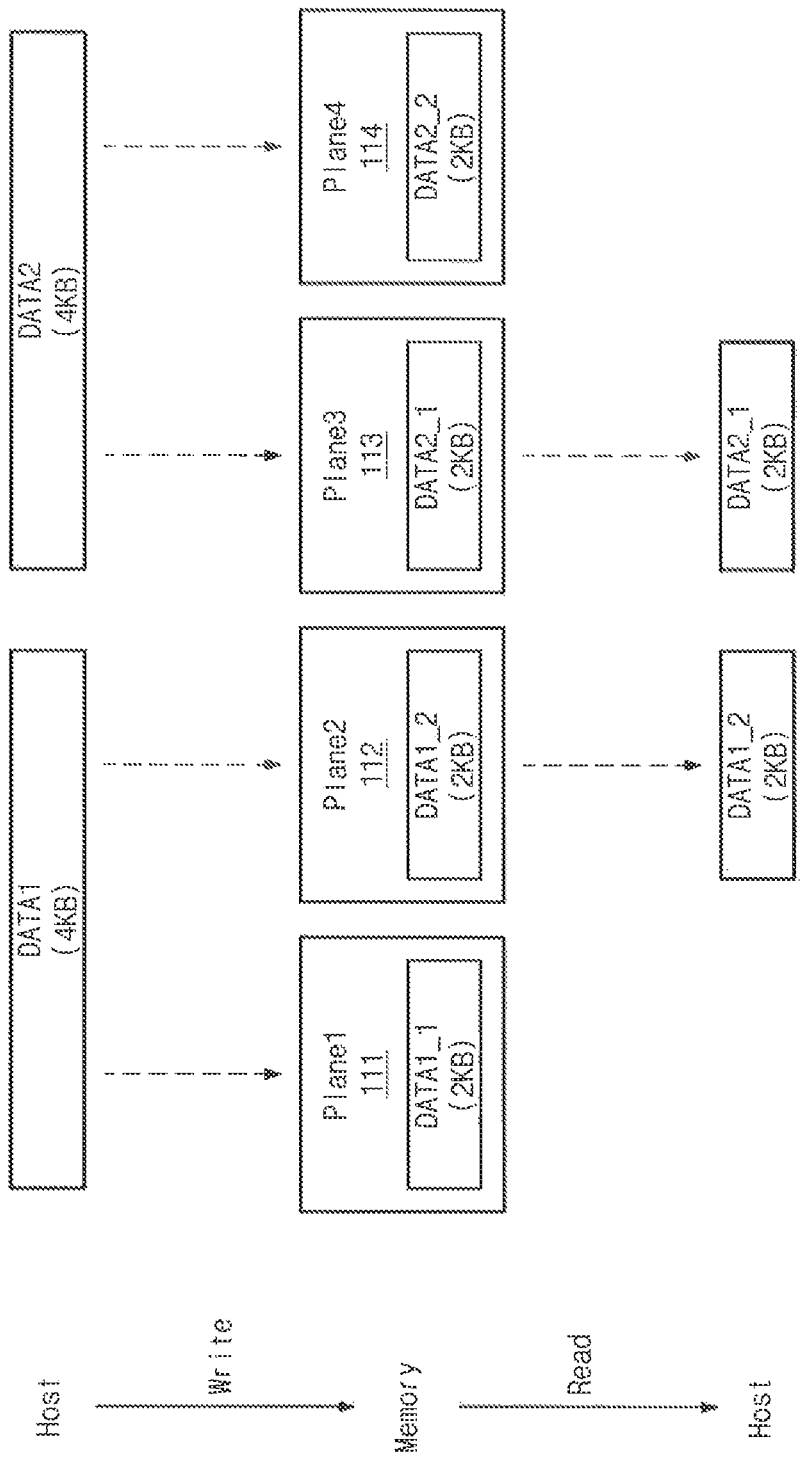
FIG. 8 is a drawing illustrating a method of inputting and outputting data based on a misalignment mapping in a second read mode of FIG. 7, according to an exemplary embodiment of the inventive concept.

FIG. 8 is a drawing illustrating a method of inputting and outputting data based on a misalignment mapping in a second read mode of FIG. 7, according to an exemplary embodiment of the inventive concept. Referring to FIG. 8, first and second data DATA1 and DATA2 may be stored through the alignment mapping as described with reference to FIG. 6. The nonvolatile memory device 100 may be requested by a host to write the first and second data DATA1 and DATA2. For example, each of the first and second data DATA1 and DATA2 may have a size of 4 KB. The nonvolatile memory device 100 may store the first and second data DATA1 and DATA2 in the first to fourth planes 111 to 114. In this case, the size of each of the first to fourth page buffer units 131 to 134 is 2 KB. Accordingly, the first data DATA1 are stored in the first and second planes 111 and 112, and the second data DATA2 are stored in the third and fourth planes 113 and 114. Partial data DATA1_1 of the first data DATA1 may be stored in the first plane 111. Partial data DATA1_2 of the first data DATA1 may be stored in the second plane 112. Partial data DATA2_1 of the second data DATA2 may be stored in the third plane 113. Partial data DATA2_2 of the second data DATA2 may be stored in the fourth plane 114.

In FIG. 8, the host may change a mapping between a logical plane and a physical plane when the host transmits a read request. For example, with regard to the first and second data DATA1 and DATA2, the partial data DATA1_2 and the partial data DATA2_1 may be maintained as valid data and the partial data DATA1_1 and the partial data DATA2_2 may be invalidated. In this case, the host may read valid data through one read operation by changing a mapping between a logical plane and a physical plane. Accordingly, the nonvolatile memory device 100 may output the partial data DATA1_2 and the partial data DATA2_1 based on the changed mapping.

Figure 9:
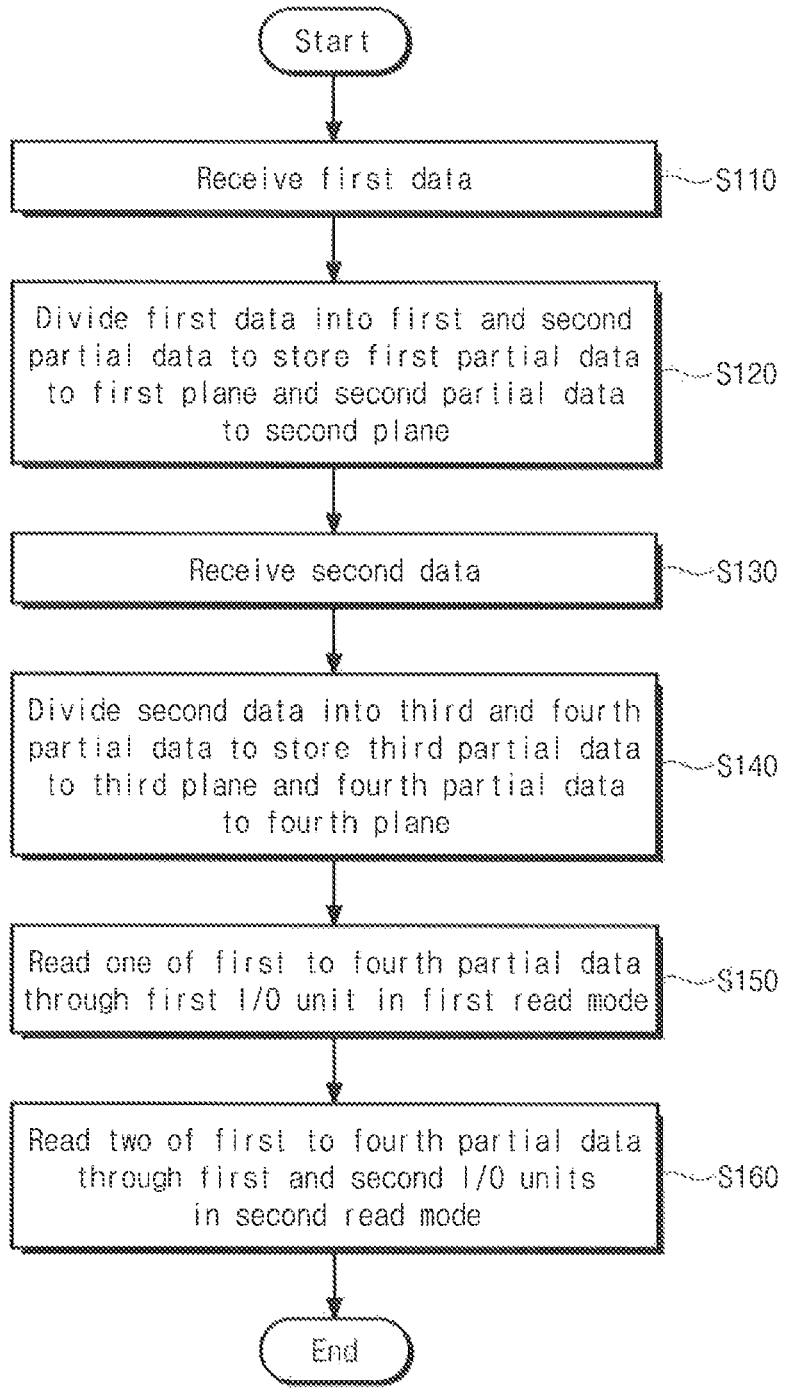
FIG. 9 is a flowchart illustrating an operating method of a nonvolatile memory device, according to an exemplary embodiment of the inventive concept.

FIG. 9 is a flowchart illustrating an operating method of a nonvolatile memory device, according to an exemplary embodiment of the inventive concept. Referring to FIGS. 1 to 9, the nonvolatile memory device 100 may read data stored in the first to fourth planes 111 to 114 by various methods. For example, the nonvolatile memory device 100 may use the first read mode in which data are read through one input/output unit and the second read mode in which data are read through two input/output units.

In operation S110, the nonvolatile memory device 100 may receive first data from a host. In operation S120, the nonvolatile memory device 100 may store the received first data after dividing the received first data into first and second partial data. For example, the nonvolatile memory device 100 may store the first partial data in the first plane 111 through the first input/output unit 141. The nonvolatile memory device 100 may store the second partial data in the second plane 112 through the second input/output unit 142. In this case, the first and second planes 111 and 112 may be set to one logical plane according to a write request of the host.

In operation S130, the nonvolatile memory device 100 may receive second data from the host. In operation S140, the nonvolatile memory device 100 may store the received second data after dividing the received second data into third and fourth partial data. For example, the nonvolatile memory device 100 may store the third partial data in the third plane 113 through the first input/output unit 141. The nonvolatile memory device 100 may store the fourth partial data in the fourth plane 114 through the second input/output unit 142. In this case, the third and fourth planes 113 and 114 may be set to one logical plane according to a write request of the host.

In operation S150, the nonvolatile memory device 100 may read one of the first to fourth partial data through the first input/output unit 141 in the first read mode. In this case, one of the first to fourth planes 111 to 114 may be set to one logical plane according to a read request of the host.

In operation S160, the nonvolatile memory device 100 may read two of the first to fourth partial data through the first and second input/output units 141 and 142 in the second read mode. In this case, two of the first to fourth planes 111 to 114 may be set to one logical plane according to a read request of the host. For example, the first and second planes 111 and 112 may be set to one logical plane. In addition, the second and third planes 112 and 113 may be set to one logical plane. In other words, two of the first to fourth planes 111 to 114 may variously be set to a logical plane based on the data.

Figure 10:
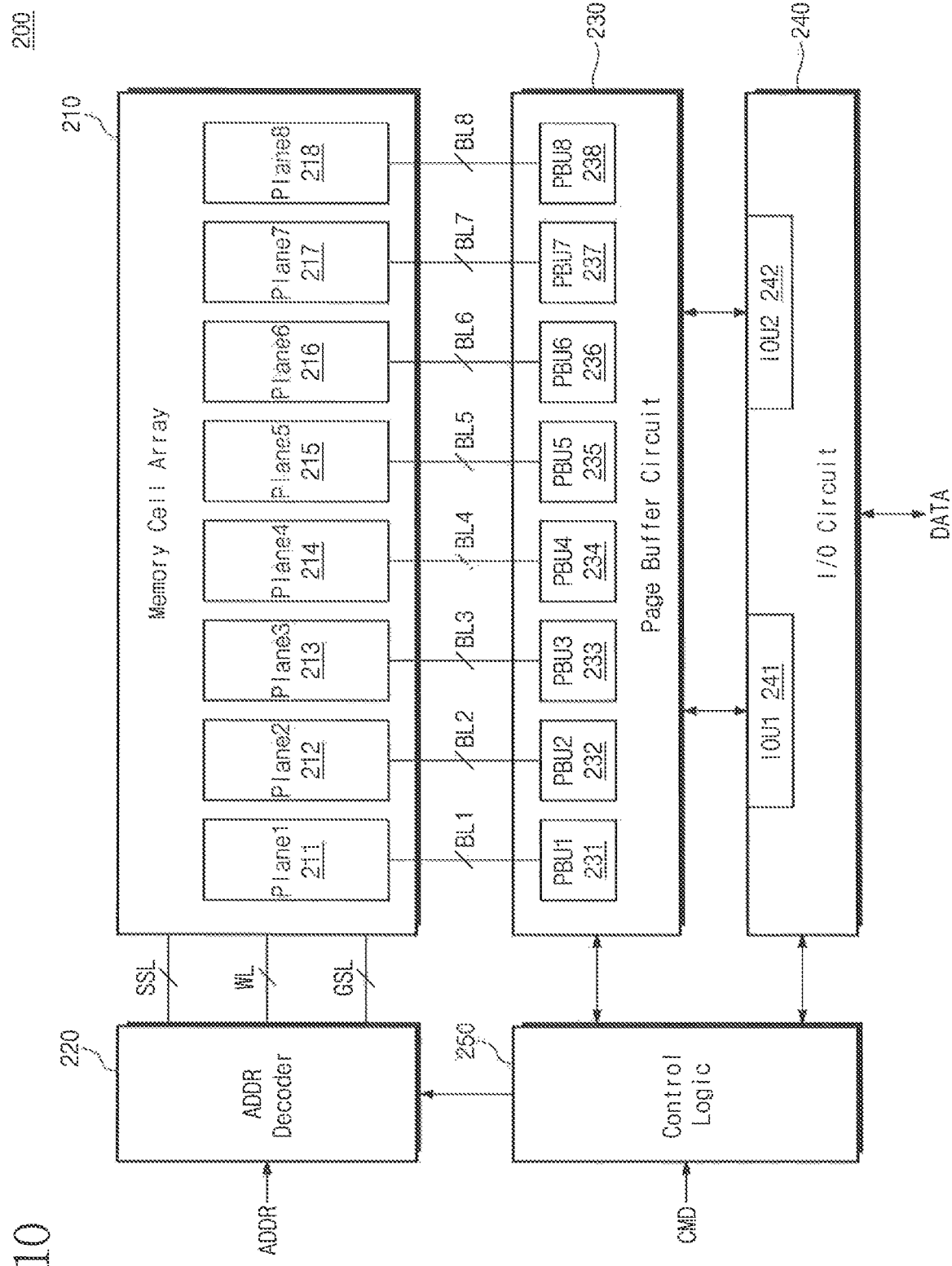
FIG. 10 is a block diagram of a nonvolatile memory device according to an exemplary embodiment of the inventive concept.

FIG. 10 is a block diagram of a nonvolatile memory device according to an exemplary embodiment of the inventive concept. Referring to FIG. 10, a nonvolatile memory device 200 may include a configuration that is similar to that of the nonvolatile memory device 100 illustrated in FIG. 1, and thus, a duplicate description is not provided. For example, address decoder 220 in FIG. 10 may be the same as or substantially similar to that shown in FIG. 1. In addition, control logic 250 in FIG. 10 may be the same as or substantially similar to that shown in FIG. 1.

A memory cell array 210 may include first to eighth planes 211 to 218. For example, the first to eighth planes 211 to 218 may be respectively connected with first to eighth page buffer units 231 to 238 through first to eighth bit lines BL1 to BL8. The first to eighth page buffer units 231 to 238 are included in a page buffer circuit 230. In an exemplary embodiment of the inventive concept, each of the first to eighth page buffer units 231 to 238 may have a size of 2 KB. Each of the first to eighth page buffer units 231 to 238 may input and output data through the first and second input/output units 241 and 242. The first and second input/output units 241 and 242 are included in an input/output circuit 240.

Figure 11:
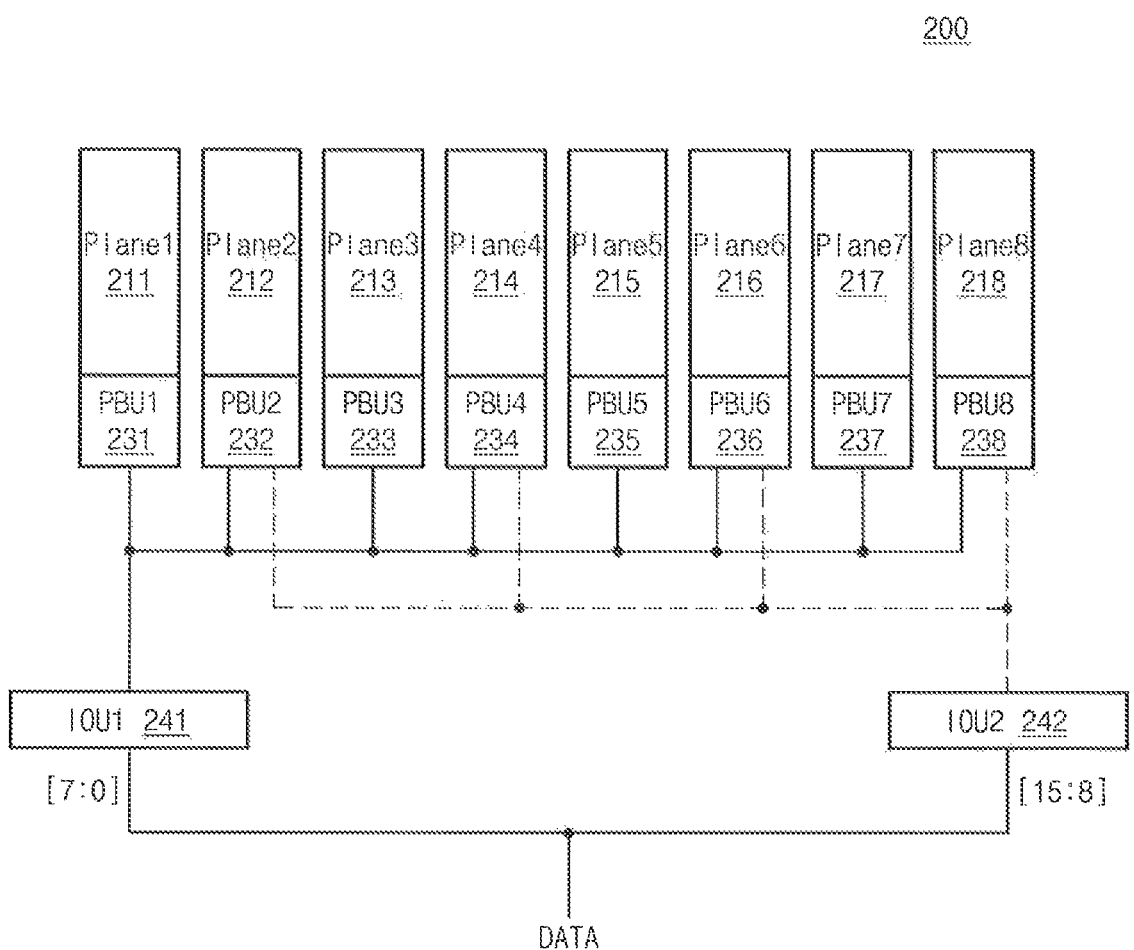
FIG. 11 is a drawing illustrating a connection relationship between planes and input/output units of FIG. 10, according to an exemplary embodiment of the inventive concept.

FIG. 11 is a drawing illustrating a connection relationship between planes and input/output units of FIG. 10, according to an exemplary embodiment of the inventive concept. Referring to FIG. 10 and FIG. 11, the first to eighth planes 211 to 218 may be connected with the first to eighth page buffer units 231 to 238, respectively.

For example, the first input/output unit 241 may be connected with all the first to eighth page buffer units 231 to 238. The second input/output unit 242 may be connected with the second, fourth, sixth, and eighth page buffer units 232, 234, 236, and 238. The connection between first and second input/output units 241 and 242 and the first to eighth page buffer units 231 to 238 may be changed according to a read mode. In an exemplary embodiment of the inventive concept, the first input/output unit 241 may input and output lower bits [7:0] of data, and the second input/output unit 242 may input and output upper bits [15:8] of the data.

Figure 12:
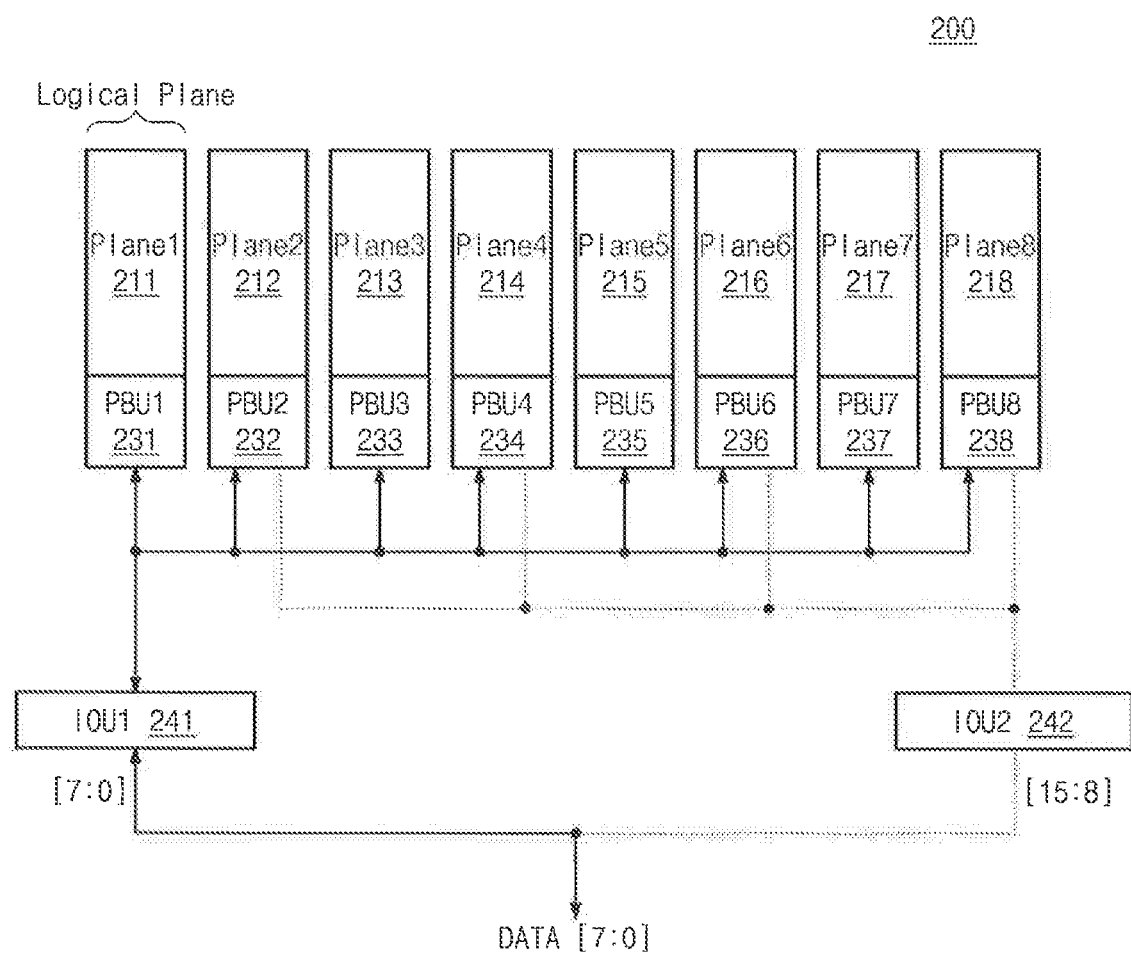
FIG. 12 is a drawing illustrating data input/output of a first read mode in a connection relationship of FIG. 11, according to an exemplary embodiment of the inventive concept.

FIG. 12 is a drawing illustrating data input/output of a first read mode in a connection relationship of FIG. 11, according to an exemplary embodiment of the inventive concept. Referring to FIG. 12, in the first read mode, the nonvolatile memory device 200 may activate the first input/output unit 241 and may deactivate the second input/output unit 242. Each of the first to eighth page buffer units 231 to 238 may input and output data only through the first input/output unit 241. For example, if the first input/output unit 241 inputs and outputs data in units of 8 bits, the nonvolatile memory device 100 may input and output data in units of 8 bits. In the case where a host maps one logical plane onto one physical plane, the nonvolatile memory device 200 may input and output data to and from each page buffer unit through the first input/output unit 141 as illustrated in FIG. 11.

Figure 13:
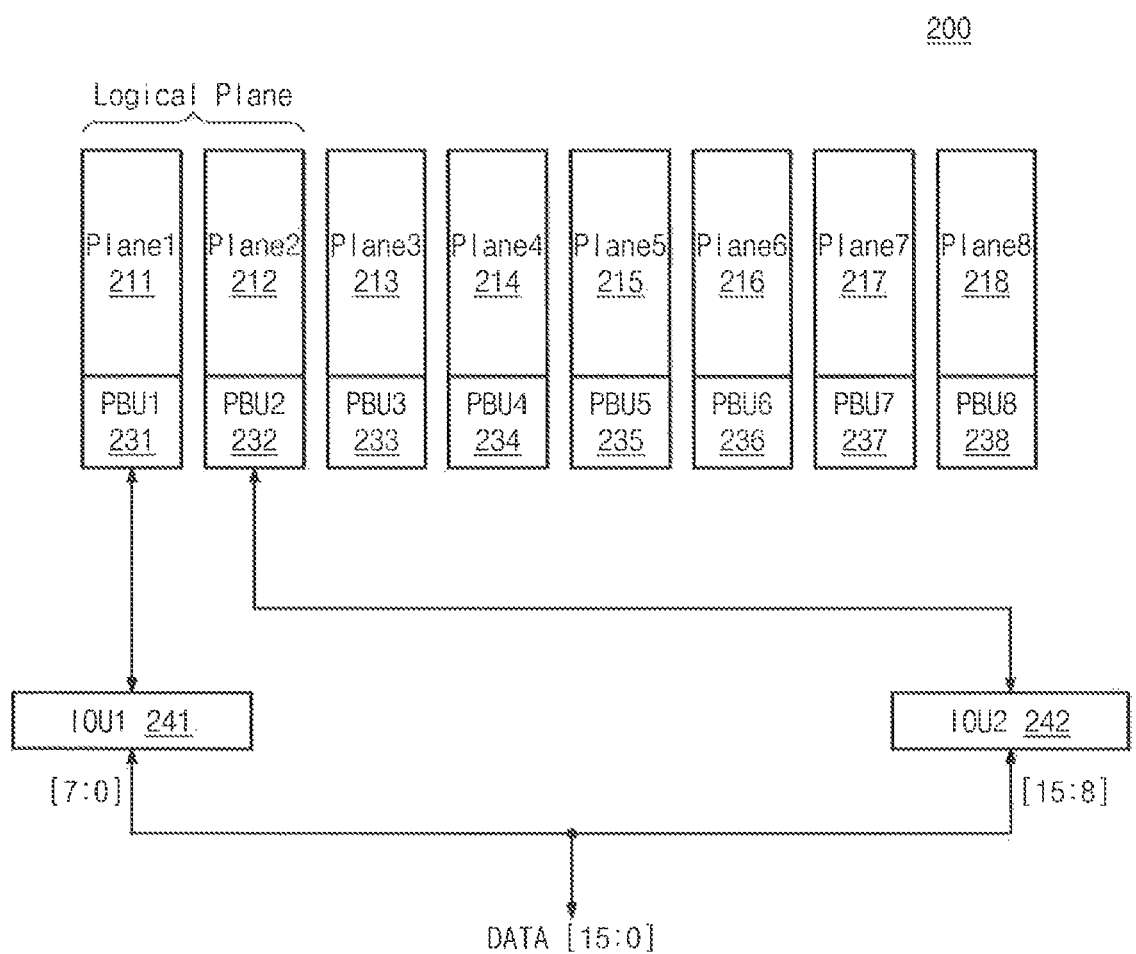
FIG. 13 is a drawing illustrating data input/output of a second read mode in a connection relationship of FIG. 11, according to an exemplary embodiment of the inventive concept.

FIG. 13 is a drawing illustrating data input/output of a second read mode in a connection relationship of FIG. 11, according to an exemplary embodiment of the inventive concept. Referring to FIG. 13, in the second read mode, the nonvolatile memory device 100 may activate both the first and second input/output units 241 and 242. The first page buffer unit 231 may input and output data through the first input/output unit 241. Likewise, each of the third, fifth, and seventh page buffer units 233, 235, and 237 may input and output data through the first input/output unit 241. The second page buffer unit 232 may input and output data through the second input/output unit 242. Likewise, each of the fourth, sixth, and eighth page buffer units 234, 236, and 238 may input and output data through the second input/output unit 242. The nonvolatile memory device 200 may input and output a portion of data through the first input/output unit 241 and may input and output the rest of the data through the second input/output unit 242. For example, if each of the first and second input/output units 241 and 242 inputs and outputs data in units of 8 bits, the nonvolatile memory device 200 may input and output data in units of 16 bits.

In addition, the host may map the first and second planes 211 and 212 onto one plane. The mapping may be referred to as "alignment mapping". In addition, the host may map the third and fourth planes 213 and 214 onto one logical plane. The host may map the fifth and sixth planes 215 and 216 onto one logical plane. The host may map the seventh and eighth planes 217 and 218 onto one logical plane.

Figure 14:
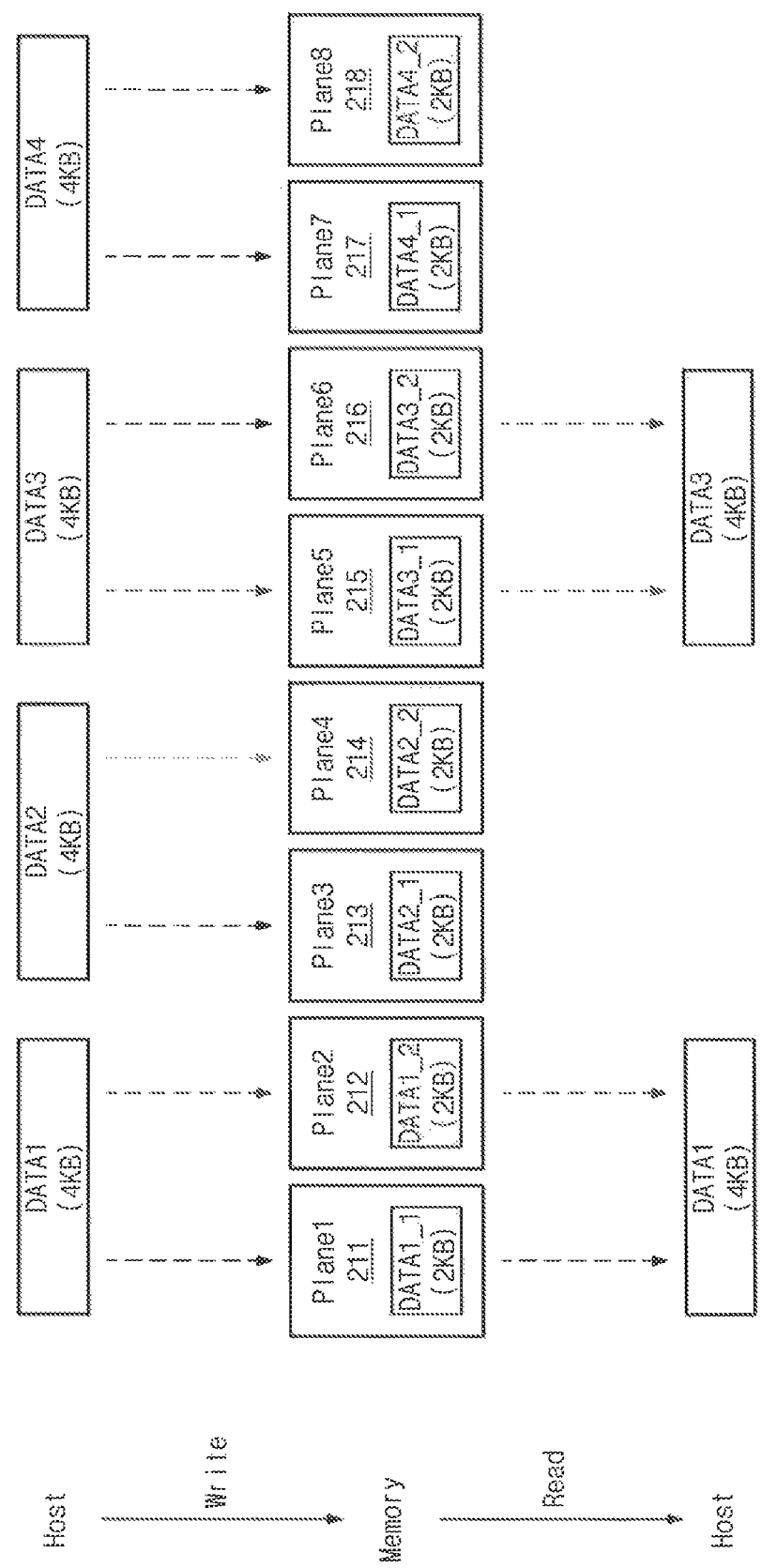
FIG. 14 is a drawing illustrating data input/output in a second read mode of FIG. 13, according to an exemplary embodiment of the inventive concept.

FIG. 14 is a drawing illustrating data input/output in a second read mode of FIG. 13, according to an exemplary embodiment of the inventive concept. Referring to FIG. 14, the nonvolatile memory device 200 may be requested by a host to write first to fourth data DATA1 to DATA4. For example, each of the first to fourth data DATA1 to DATA4 may have a size of 4 KB. The nonvolatile memory device 200 may store the first to fourth data DATA1 to DATA4 in the first to eighth planes 211 to 218 in this case, the size of each of the first to eighth page buffer units 231 to 238 is 2 KB. Accordingly, the first data DATA1 are stored in the first and second planes 211 and 212. Partial data DATA1_1 of the first data DATA1 may be stored in the first plane 211. Partial data DATA1_2 of the first data DATA1 may be stored in the second plane 212. The second to fourth data DATA2 to DATA4 may be stored in the third to eighth planes 213 to 218 in the same manner as the first data DATA1. For example, the third data DATA3 are stored in the fifth and sixth planes 215 and 216. Partial data DATA3_1 of the third data DATA3 may be stored in the fifth plane 215. Partial data DATA3_2 of the third data DATA3 may be stored in the sixth plane 216.

In addition, the nonvolatile memory device 200 may be requested by the host to perform a sequential read on the first and third data DATA1 and DATA3. The nonvolatile memory 200 may read and output partial data for each logical plane. For example, the nonvolatile memory device 200 may read data from the first and second planes 211 and 212 to output the first data DATA1. In addition, the nonvolatile memory device 200 may read data from the fifth and sixth planes 215 and 216 to output the third data DATA3.

Figure 15:
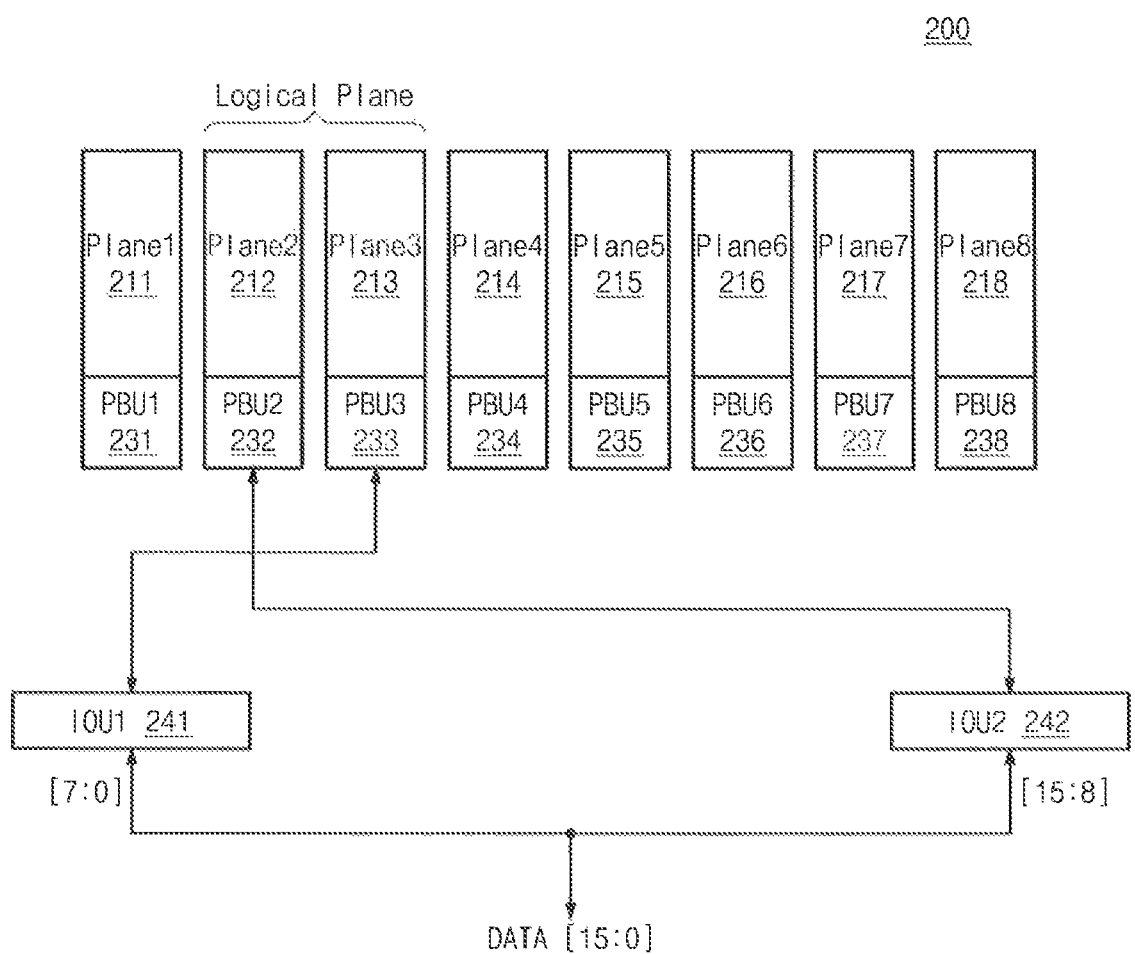
FIG. 15 is a drawing illustrating a method of inputting and outputting data based on a misalignment mapping, according to an exemplary embodiment of the inventive concept.

FIG. 15 is a drawing illustrating a method of inputting and outputting data based on a misalignment mapping, according to an exemplary embodiment of the inventive concept. Referring to FIG. 15, a host may map a logical plane and a physical plane in a manner that is different from that described with reference to FIG. 13. For example, the host may map the second and third planes 212 and 213 onto one logical plane. According to the structure described with reference to FIG. 10, data may be input to and output from the second plane 212 through the second input/output unit 242. In addition, data may be input to and output from the third plane 213 through the first input/output unit 241. Accordingly, lower bits [7:0] of the data may be stored in the third plane 213. Upper bits [15:8] of the data may be stored in the second plane 212.

Figure 16:
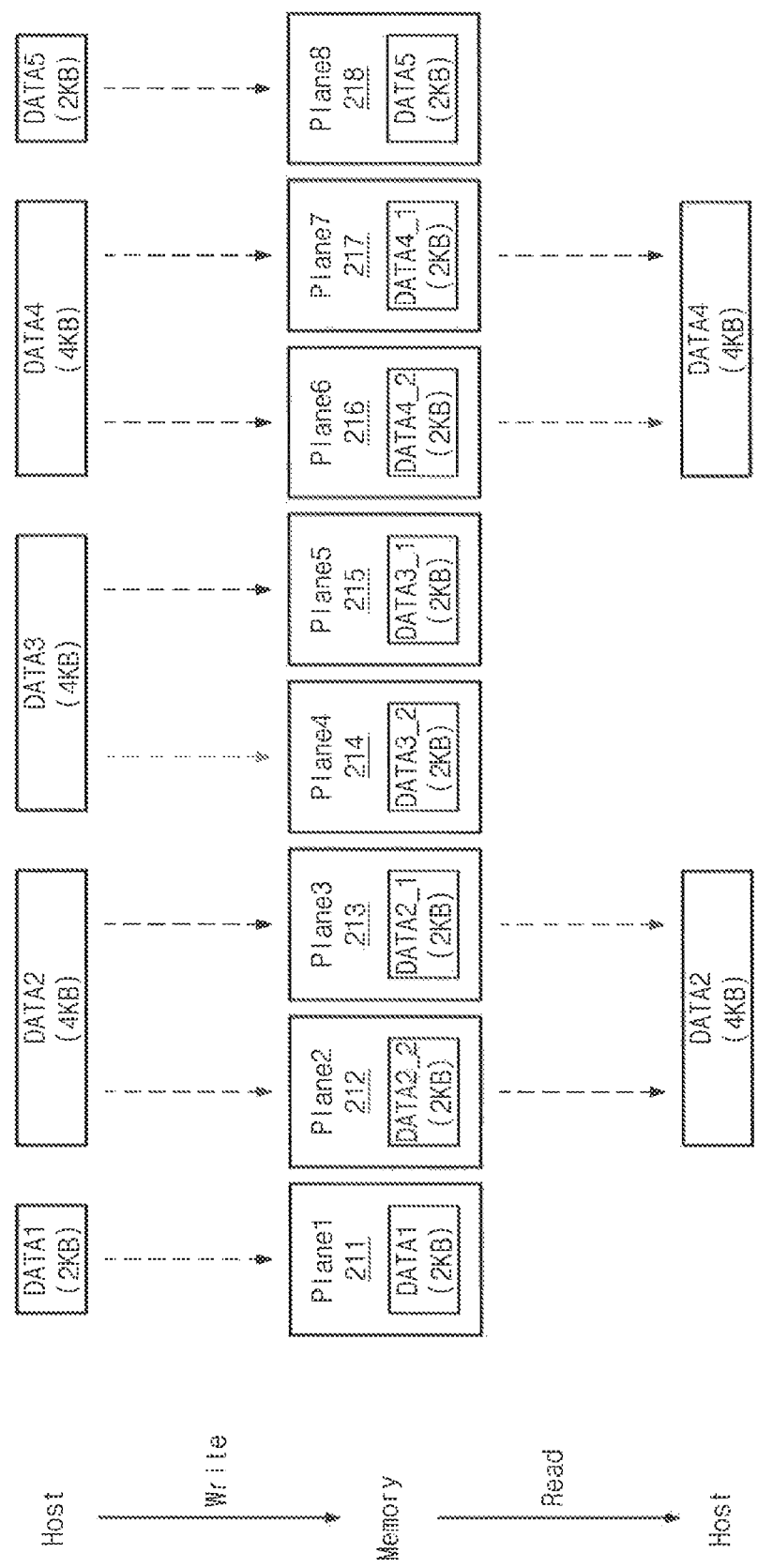
FIG. 16 is a drawing illustrating a method of inputting and outputting data based on a misalignment mapping in a second read mode of FIG. 15, according to an exemplary embodiment of the inventive concept.

FIG. 16 is a drawing illustrating a method of inputting and outputting data based on a misalignment mapping in a second read mode of FIG. 15, according to an exemplary embodiment of the inventive concept. Referring to FIG. 16, the first to fifth data DATA1 to DATA5 may have different sizes. The nonvolatile memory device 200 may be requested by a host to write the first to fifth data DATA1 to DATA5. For example, each of the first and fifth data DATA1 and DATA5 may have a size of 2 KB. Each of the second to fourth data DATA2 to DATA4 may have a size of 4 KB. The nonvolatile memory device 200 may store the first and fifth data DATA1 and DATA5 in the first and eighth planes 211 and 218, respectively. The nonvolatile memory device 200 may store the second to fourth data DATA2 to DATA4 in the second to seventh planes 212 to 217. In this case, the size of each of the first to eighth page buffer units 231 to 238 is 2 KB.

Figure 17:
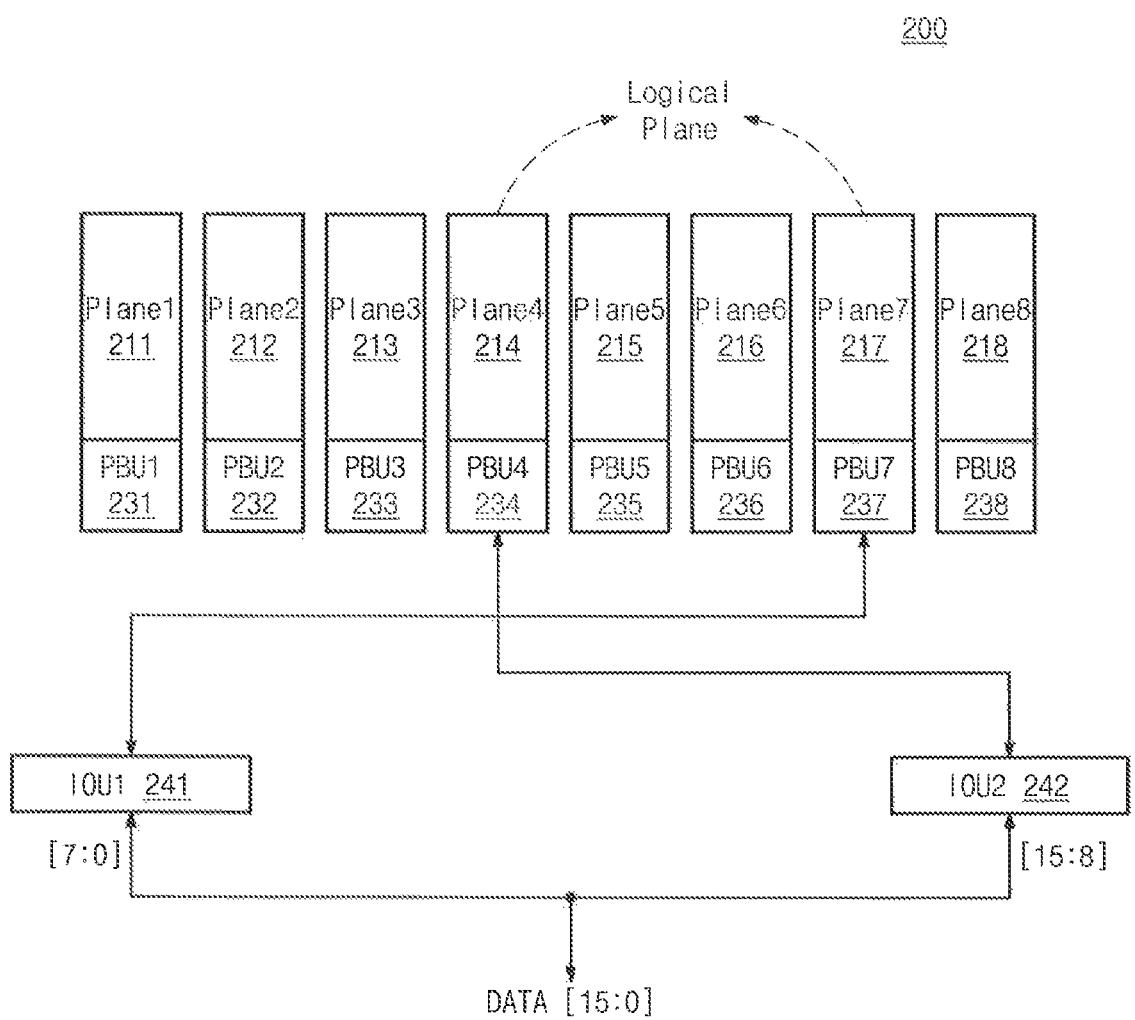
FIG. 17 is a drawing illustrating a method of inputting and outputting data based on a misalignment mapping, according to an exemplary embodiment of the inventive concept.

FIG. 17 is a drawing illustrating a method of inputting and outputting data based on a misalignment mapping, according to an exemplary embodiment of the inventive concept. Referring to FIG. 17, a host may map the fourth and seventh planes 213 and 217 onto one logical plane. In response to a read request of the host, the nonvolatile memory device 200 may output data stored in the seventh plane 217 through the first input/output unit 241 and may output data stored in the fourth plane 214 through the second input/output unit 242.

Figure 18:
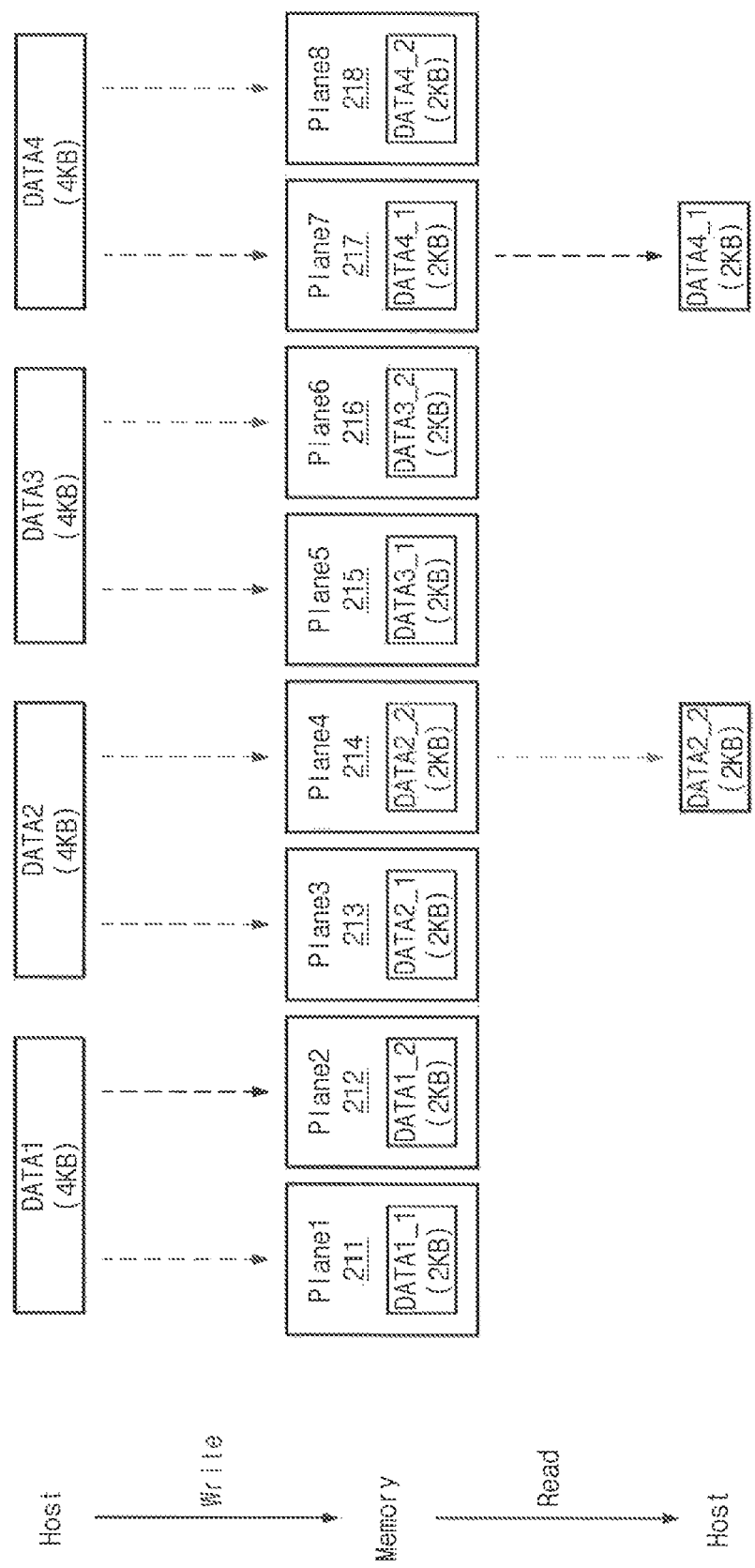
FIG. 18 is a drawing illustrating data input/output based on a misalignment mapping of FIG. 17, according to an exemplary embodiment of the inventive concept.

FIG. 18 is a drawing illustrating data input/output based on a misalignment mapping of FIG. 17, according to an exemplary embodiment of the inventive concept. Referring to FIG. 18, the first to fourth data DATA1 to DATA4 may be stored through the alignment mapping. In this case, the host may change mapping such that the fourth and seventh planes 214 and 217 are set to one logical plane. The nonvolatile memory device 200 may output partial data DATA2_2 and DATA4_1 stored in the fourth and seventh planes 214 and 217 in response to a read request of the host.

Figure 19:
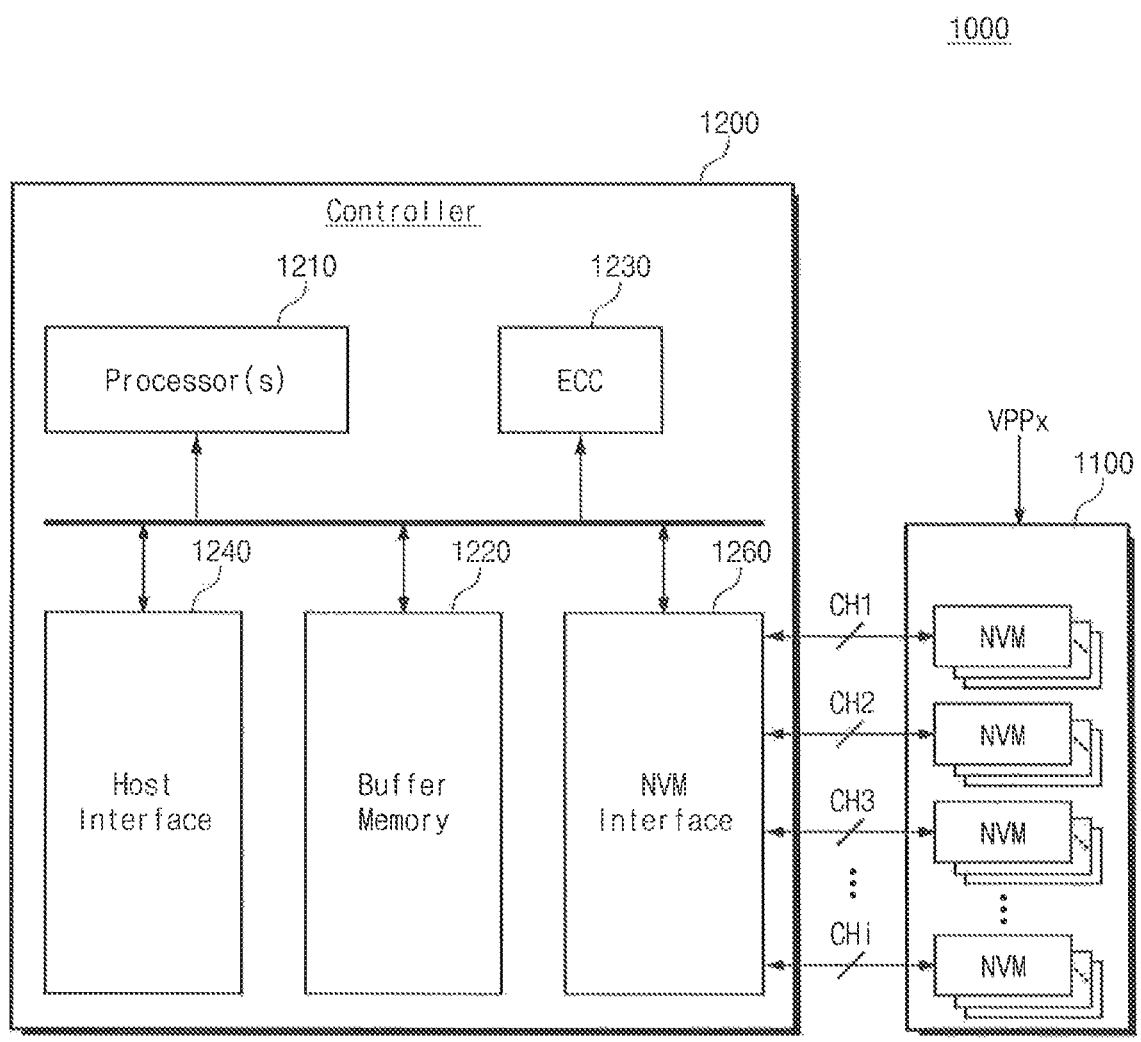
FIG. 19 is a block diagram illustrating a memory system, according to an exemplary embodiment of the inventive concept.

FIG. 19 is a block diagram illustrating a memory system, according to an exemplary embodiment of the inventive concept. Referring to FIG. 19, a memory system 1000 may include a plurality of nonvolatile memory devices 1100 and a memory controller 1200.

The nonvolatile memory devices 1100 may optionally receive an external high voltage Vppx. Each of the nonvolatile memory devices 1100 may include a plurality of planes and a plurality of input/output units as described with reference to FIGS. 1 to 18. In each of the nonvolatile memory devices 1100, at least two of the plurality of planes may be set to one logical plane according to a request of a host. Each of the nonvolatile memory devices 1100 may form a logical plane, which the host requests, by combining the plurality of planes and the plurality of input/output units.

The memory controller 1200 is connected to the nonvolatile memory devices 1100 through a plurality of channels CH1 to CHi (e.g., i being an integer of 2 or more). The memory controller 1200 may include at least one processor 1210, a buffer memory 1220, an error correction circuit (ECC) 1230, a host interface 1240, and a nonvolatile memory interface 1260.

The buffer memory 1220 may temporarily store data needed to drive the memory controller 1200. The buffer memory 1220 may include a plurality of memory lines storing data or a command.

The error correction circuit 1230 may calculate a value of an error correction code of data to be programmed in a write operation, may connect data read in a read operation based on the value of the error correction code, and may correct an error of data recovered from the nonvolatile memories 1100 in a data recovery operation. The memory controller 1200 may further include a code memory that stores code data for an operation of the controller 1220. The code memory may be a nonvolatile memory device.

The host interface 1240 may provide an interface function for interfacing with the host. Here, the host interface 1240 may be a NAND flash interface. The nonvolatile memory interface 1250 may provide an interface function for interfacing with nonvolatile memory device 1100.

According to an exemplary embodiment of the inventive concept, there is provided a nonvolatile memory device that includes a plurality of input/output units to map a plurality of physical planes onto a logical plane and n operating method thereof.

While the inventive concept has been described with reference to exemplary embodiments thereof, it will be apparent to those skilled in the art that various changes and modifications may be made thereto without departing from the spirit and scope of the inventive concept as defined by the claims. Therefore, it should be understood that the above embodiments are not limiting, but illustrative.

What is claimed is:

1. An operating method of a nonvolatile memory device that comprises first, second, third and fourth planes, the method comprising:

receiving first data;

dividing the first data into first and second partial data and storing the first partial data in the first plane and the second partial data in the second plane;

receiving second data;

dividing the second data into third and fourth partial data and storing the third partial data in the third plane and the fourth partial data in the fourth plane;

outputting one of the first, second, third and fourth partial data through a first input/output unit in a first read mode; and outputting two of the first, second, third and fourth partial data through the first input/output unit and a second input/output unit in a second read mode.

2. The method of claim 1, wherein in the first read mode, each of the first, second, third and fourth planes is set to one logical plane.

3. The method of claim 1, wherein in the second read mode, two of the first, second, third and fourth planes are set to one logical plane.

4. The method of claim 1, wherein in the second read mode, the first and second planes are set to a first logical plane and the third and fourth planes are set to a second logical plane.

5. The method of claim 1, wherein in the second read mode, the first and fourth planes are set to a first logical plane and the second and third planes are set to a second logical plane.

6. The method of claim 1, wherein in the second read mode, the first and third partial data are output through the first input/output unit.

7. The method of claim 1, wherein in the second read mode, the second and fourth partial data are output through the second input/output unit.

8. The method of claim 1, wherein in the second read mode, page buffer units connected with the first input/output unit are different from page buffer units connected with the second input/output unit.

9. The method of claim 1, wherein the second input/output unit is deactivated in the first read mode.

10. The method of claim 1, wherein the first and third partial data comprise lower bits of data that are read requested by a host, and wherein the second and fourth partial data comprise upper bits of the data that are read requested by the host.

11. The method of claim 1, wherein an input/output size of data in the first read mode is different from an input/output size of data in the second read mode.

12. An operation method of a nonvolatile memory device including a plurality of planes, each of the plurality of planes including a three-dimensional structure in which a plurality of memory cells are stacked in a direction perpendicular to a substrate, the operation method comprising:

receiving a first read request from an external device;

outputting first data from a first plane of the plurality of planes in response to the first read request;

receiving a second read request from the external device;

outputting second data from a second plane of the plurality of planes in response to the second read request;

receiving a third read request from the external device; and outputting the first data from the first plane and the second data from the second plane in response to the third read request.

13. The operation method of claim 12, further comprising:
receiving a fourth read request from the external device; and
outputting the first data from the first plane and third data from a third plane of the plurality of planes in response to the fourth read request.

14. The operation method of claim 13, wherein each of the outputting of the first and second data and the outputting of the first and third data is performed through one read operation.

15. The operation method of claim 13, wherein the first data is outputted through a first input/output unit, the second data is outputted through a second input/output unit, and the third data is outputted through the second input/output unit.

16. An operation method of a nonvolatile memory device including a plurality of planes, each of the plurality of planes including a three-dimensional structure in which a plurality of memory cells are stacked in a direction perpendicular to a substrate, the operation method comprising:
receiving a first write request and first data from an external device;
storing the first data in a first plane of the plurality of planes in response to the first write request;
receiving a second write request and second data from the external device;
storing the second data in a second plane of the plurality of planes in response to the second write request;
receiving a third write request, third data, and fourth data from the external device; and
storing the third data in the first plane and the fourth data in the second plane in response to the third write request.

17. The operation method of claim 16, further comprising:
receiving a fourth write request, fifth data, and sixth data from the external device; and
storing the fifth data in the first plane and the sixth data in a third plane of the plurality of planes in response to the fourth write request.

18. The operation method of claim 17, further comprising:
receiving a fifth write request, seventh data, and eighth data from the external device; and
storing the seventh data in the third plane and the eighth data in a fourth plane of the plurality of planes in response to the fifth write request.

19. The operation method of claim 18, further comprising:
receiving a first read request from the external device; and
outputting the third data from the first plane and the eighth data from the fourth plane in response to the first read request.

20. The operation method of claim 19, further comprising:
receiving a second read request from the external device;
outputting one of the third data from the first plane and the fourth data from the second plane in response to the second read request;
receiving a third read request from the external device; and
outputting one of the seventh data from the third plane and the eighth data from the fourth plane in response to the third read request.

* * * * *